United States Patent
Wu et al.

[11] Patent Number: 5,876,508
[45] Date of Patent: Mar. 2, 1999

[54] METHOD OF CLEANING SLURRY REMNANTS AFTER THE COMPLETION OF A CHEMICAL-MECHANICAL POLISH PROCESS

[75] Inventors: Kun-Lin Wu, Tai Chung; Chien-Hsien Lai, Feng Shan; Horng-Bor Lu; Jenn-Tarng Lin, both of Hsinchu, all of Taiwan

[73] Assignee: United Microelectronics Corporation, Hsinchu, Taiwan

[21] Appl. No.: 818,898

[22] Filed: Mar. 17, 1997

[30] Foreign Application Priority Data

Jan. 24, 1997 [TW] Taiwan ................................. 86100814

[51] Int. Cl.[6] .......................... C03C 25/00; C23G 1/02; B08B 3/02
[52] U.S. Cl. .................................. 134/2; 134/3; 134/42; 438/692; 438/959
[58] Field of Search ................................. 438/691, 692, 438/693, 959; 156/345; 451/286, 287, 288, 921; 134/3, 2, 38, 42

[56] References Cited

U.S. PATENT DOCUMENTS

| 4,680,893 | 7/1987 | Cronkhite ........................................ 51/5 |
| 5,081,068 | 1/1992 | Endo et al. ................................ 437/225 |
| 5,531,861 | 7/1996 | Yu et al. ................................ 156/636.1 |
| 5,575,837 | 11/1996 | Kodama et al. ............................. 106/3 |
| 5,578,529 | 11/1996 | Mullins ..................................... 437/228 |
| 5,616,069 | 4/1997 | Walker et al. .............................. 451/56 |
| 5,643,406 | 7/1997 | Shimomura et al. ................. 156/636.1 |
| 5,645,682 | 7/1997 | Skovran ................................ 156/636.1 |
| 5,700,383 | 12/1997 | Feller et al. ................................ 216/88 |
| 5,725,417 | 3/1998 | Robinson .................................... 451/56 |

*Primary Examiner*—Marian C. Knode
*Assistant Examiner*—Mary K. Zeman
*Attorney, Agent, or Firm*—Oblon, Spivak, McClelland, Maier & Neustadt, P.C.

[57] ABSTRACT

A method for effectively cleaning the slurry remnants left on a polishing pad after the completion of a chemical mechanical polish (CMP) process is provided. This method is able to substantially thoroughly clean away all of the slurry remnants left on the polishing pad. In the method of the invention, the first step is to prepare a cleaning agent which is a mixture of $H_2O_2$, deionized water, an acid solution, and an alkaline solution mixed to a predetermined ratio. The cleaning agent is subsequently directed to a nozzle formed in the pad dresser. This allows the cleaning agent to be jetted forcibly onto the slurry remnants on the polishing pad so as to clean the slurry remnants away from the polishing pad. The cleaning agent can be provided with predetermined ratios for various kinds of slurries so that the cleaning agent can be adjusted to be either acid or alkaline in nature. This can allow an increase in the repellent force between the particles of the slurry remnants and the underlying polishing pad that is caused by the so-called zeta potential, thus allowing the slurry remnants to be more easily removed from the polishing pad.

6 Claims, 2 Drawing Sheets

METHOD OF CLEANING SLURRY REMNANTS AFTER THE COMPLETION OF A CHEMICAL-MECHANICAL POLISH PROCESS

BACKGROUND OF THE INVENTION

1. Field of the Invention

This invention relates to semiconductor fabrication processes, and more particularly, to a method for cleaning the slurry remnants left on a polishing pad after the completion of a chemical-mechanical polish (CMP) process conducted for global planarization of a semiconductor wafer.

2. Description of Related Art

In the fabrication of semiconductor products, such as CPUs and various memory devices, the CMP technique is a global planarization process which can a provide flat and polished surface for a semiconductor wafer. It is currently the only semiconductor technology that can provide a global planarization of semiconductor wafers.

In a CMP process, the surface of the wafer that is to be polished (hereinafter referred to as the process surface of the wafer) is placed upside down on a polishing pad on a CMP machine. The polishing pad can be rotated so as to rub against the process surface of the wafer. During the CMP process, a chemical agent, which is customarily referred to as a slurry, is applied on the wafer to assist the polishing pad in polishing the process surface of the wafer.

The slurry can be a mixture of colloidal silica, dispersed alumina, and an alkaline solution, such as KOH or $NH_4OH$ or $CeO_2$ base slurry. The colloidal silica and dispersed alumina particles, which are highly abrasive in nature can help to polish the process surface of the wafer on the polishing pad.

After the completion of each CMP process, the slurry remnants left on the polishing pad should be cleaned away prior to conducting a subsequent CMP process on another wafer. One conventional method of cleaning the slurry remnants left on the polishing pad after the completion of a CMP process is depicted in detail in the following with reference to FIGS. 1A and 1B.

Referring to FIG. 1A, there is shown a polishing pad 10 after the completion of a CMP process. This polishing pad 10 has been treated by a pad dresser (not shown). After the CMP process, a large amount of slurry remnants 12 are left on the polishing pad 10, which should be cleaned away before another wafer can be placed and polished on the polishing pad 10. To remove the slurry remnants 12, a stream of deionized water 14 is jetted on the polishing pad 10 so as to clean away the slurry remnants 12 left on the polishing pad 10.

One drawback to the foregoing method, however, is that it is not effective at thoroughly cleaning away all of the slurry remnants 12 left on the polishing pad 10. As shown in FIG. 1B, a small amount of the slurry remnants 12 may still remain on the polishing pad 10. When these uncleaned slurry remnants 12 dry out, they could cause scratches to the subsequent wafers that are placed on the polishing pad 10 to undergo a CMP process. This will significantly affect the wafer yield rate.

SUMMARY OF THE INVENTION

It is therefore a primary objective of the present invention to provide a method for cleaning the slurry remnants left on a polishing pad after the completion of a CMP process which is able to substantially and thoroughly clean away all of the slurry remnants left on the polishing pad.

It is another objective of the present invention to provide a method for cleaning the slurry remnants left on a polishing pad after the completion of a CMP process which allows the slurry remnants left on the polishing pad to be more easily cleaned away.

In accordance with the foregoing and other objectives of the present invention, a new method for cleaning the slurry remnants left on a polishing pad after the completion of a CMP process is provided.

In the method of the invention, the first step is to prepare a cleaning agent which is a mixture of $H_2O_2$, deionized water, an acid solution, and an alkaline solution mixed to a predetermined ratio. The acid solution can be $KIO_3$ or $Fe(NO_3)_x$ or citric acid; while the alkaline solution can be KOH or $NH_4OH$.

The cleaning agent is directed to a nozzle formed in the pad dresser. This allows the cleaning agent to be jetted forcibly onto the slurry remnants remaining on the polishing pad so as to clean the slurry remnants away from the polishing pad.

It is a distinctive feature of the invention that the cleaning agent can be provided with predetermined ratios for various kinds of slurries so that the cleaning agent can be adjusted to be either acid or alkaline in nature. This can allow an increase in the repellent force between the particles of the slurry remnants and the underlying polishing pad that is caused by the so-called zeta potential, thus allowing the slurry remnants to be more easily removed from the polishing pad.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1A:
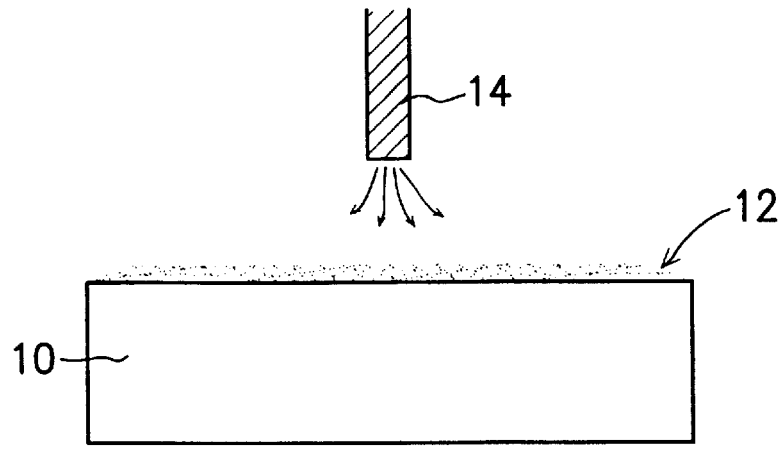
FIGS. 1A and 1B are schematic sectional diagrams used to explain the drawbacks of a conventional method for cleaning the slurry remnants left on a polishing pad after the completion of a CMP process.
Figure 1B:
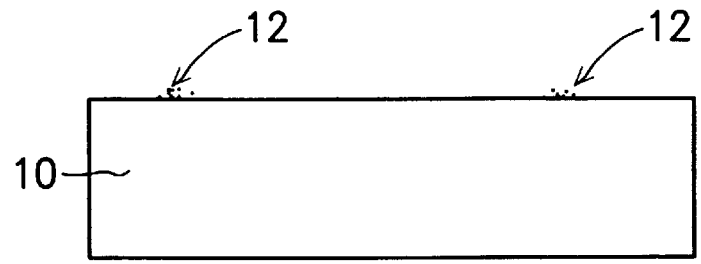
Figure 2A:
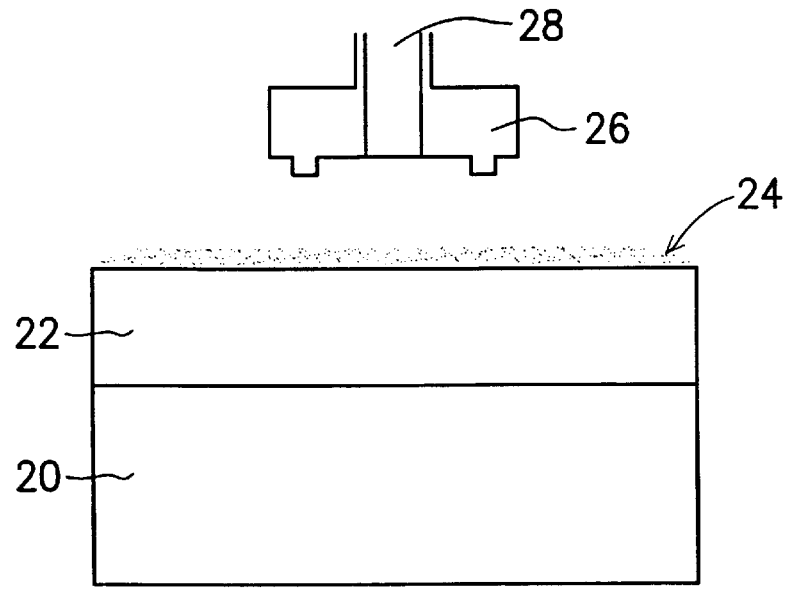
FIGS. 2A through 2C are schematic sectional diagrams used to depict a method according to the present invention for cleaning the slurry remnants left on a polishing pad after the completion of a CMP process.
Figure 2B:
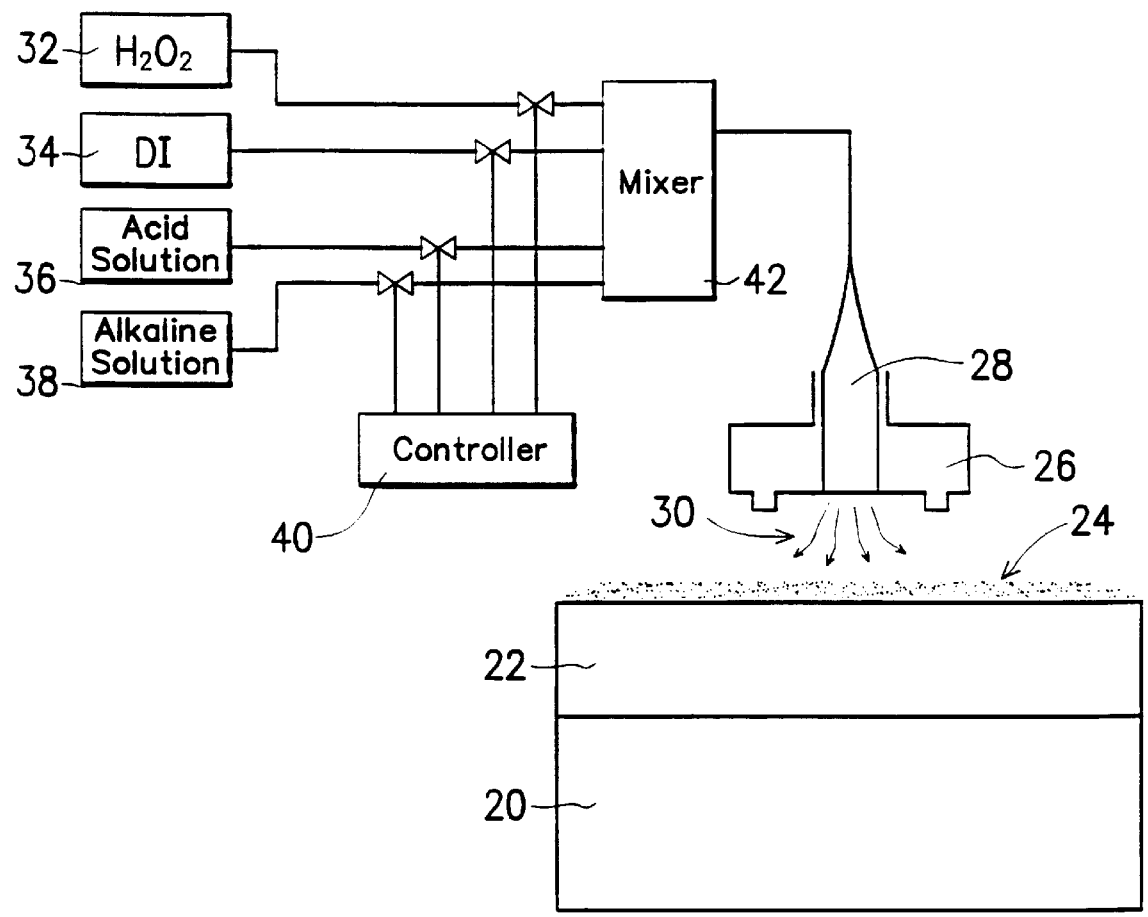
Figure 2C:
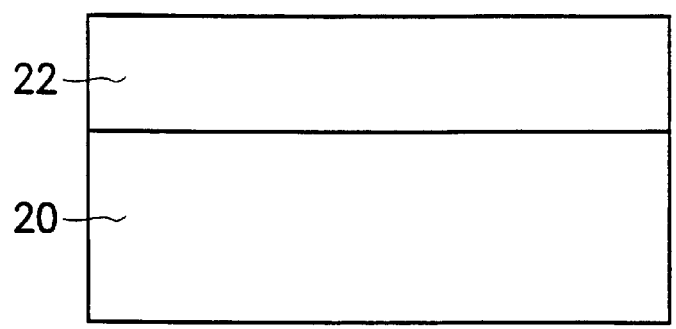

FIGS. 2A through 2C are schematic sectional diagrams used to depict a method according to the present invention for cleaning the slurry remnants left on a polishing pad after the completion of a CMP process.

Referring to FIG. 2A, there is shown a schematic sectional diagram of a CMP machine after the completion of a CMP process, in which the reference numeral 20 designates a platform on which a polishing pad 22 is mounted. Above the polishing pad 22, a pad dresser 26 is mounted. This pad dresser 26 is formed with a nozzle 28 therein. After the completion of a CMP process, a large amount of slurry remnants 24 are left on the polishing pad 22.

Referring next to FIG. 2B, the slurry remnants 24 left on the polishing pad 22 are to be cleaned away by the method of the invention. In accordance with the invention, a cleaning agent 30, which is a mixture of $H_2O_2$, deionized (DI) water, an acid solution, and an alkaline solution mixed to a predetermined ratio, is used to clean away the slurry remnants 24. The acid solution can be $KIO_3$ or $Fe(NO_3)_x$ or citric acid; while the alkaline solution can be KOH or $NH_4OH$. As shown in FIG. 2B, the four constituent substances of the cleaning agent 30 are respectively supplied by an $H_2O_2$ source 32, a deionized water source 34, an acid solution source 36, and an alkaline solution source 38. The output flow rates of the $H_2O_2$ source 32, the deionized water source 34, the acid solution source 36, and the alkaline solution source 38 are controlled by a controller 40 in such a manner as to mix the four substances to a predetermined ratio in a mixer 42 to form a mixture serving as the cleaning agent 30. Then, the cleaning agent 30 is directed to the nozzle 28 and jetted therefrom onto the slurry remnants 24 on the polishing pad 22. The cleaning agent 30 can then clean the slurry remnants 24 away from the polishing pad 22. Through experiments, the cleaning agent 30 is able to substantially and thoroughly clean all of the slurry remnants 24 away from the polishing pad 22, allowing the polishing pad 22 to be substantially left with no slurry remnants, as illustrated in FIG. 2C.

It is a distinctive feature of the invention that the cleaning agent 30 can be provided with predetermined ratios for various kinds of slurries so that the cleaning agent 30 can be adjusted to be either acid or alkaline in nature. This can allow an increase in the repellent force between the particles of the slurry remnants and the underlying polishing pad that is caused by the so-called zeta potential, thus allowing the slurry remnants to be more easily removed from the polishing pad.

Furthermore, the method of the invention is applicable whether the polishing pad is facing upward or downward. If facing downward, the cleaning agent can be jetted upward from beneath onto the downward-facing surface of the polishing pad.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for cleaning the slurry remnants left on a polishing pad after the completion of a CMP process which includes the use of a pad dresser, comprising the steps of:

(1) preparing a cleaning agent which is a mixture of $H_2O_2$, deionized water, an acid solution, and an alkaline solution mixed to a predetermined ratio;

(2) directing the cleaning agent to a nozzle formed in the pad dresser; and (3) jetting the cleaning agent through the nozzle onto the slurry remnants remaining on the polishing pad.

2. The method of claim 1, wherein the alkaline solution is a solution of KOH.

3. The method of claim 1, wherein the alkaline solution is a solution of $NH_4OH$.

4. The method of claim 1, wherein the acid solution is a solution of $KIO_3$.

5. The method of claim 1, wherein the acid solution is a solution of $Fe(NO_3)_x$.

6. The method of claim 1, wherein the acid solution is a solution of citric acid.

* * * * *